(12) United States Patent
Chen et al.

(10) Patent No.: US 6,778,104 B2
(45) Date of Patent: Aug. 17, 2004

(54) METHOD AND APPARATUS FOR PERFORMING DSV PROTECTION IN AN EFM/EFM+ ENCODING SAME

(75) Inventors: Hong-Ching Chen, Feng-Shan (TW); Wen-Yi Wu, Chu-Pei (TW)

(73) Assignee: Media Tek, Inc., Hsinchu Hsien (TW)

( * ) Notice: Subject to any disclaimer, the term of this patent is extended or adjusted under 35 U.S.C. 154(b) by 0 days.

(21) Appl. No.: 10/266,781

(22) Filed: Oct. 8, 2002

(65) Prior Publication Data

US 2003/0227398 A1 Dec. 11, 2003

(30) Foreign Application Priority Data

Jun. 7, 2002 (TW) ........................................ 91112415 A

(51) Int. Cl.[7] .............................................. H03M 7/00
(52) U.S. Cl. ...................... 341/59; 341/69; 369/59.23
(58) Field of Search ........................... 341/58, 59, 68, 341/69; 369/59.23

(56) References Cited

U.S. PATENT DOCUMENTS

| | | | |
|---|---|---|---|
| 5,420,844 A | * 5/1995 | Kawakubo et al. | ........... 369/59 |
| 5,451,943 A | * 9/1995 | Satomura | ..................... 341/58 |
| 5,486,827 A | 1/1996 | Shimizume et al. | |
| 5,828,754 A | 10/1998 | Hogan | .......................... 380/49 |
| 5,952,944 A | * 9/1999 | Nonaka et al. | ................ 341/59 |
| 6,023,234 A | 2/2000 | Fukuoka | |
| 6,396,787 B1 | 5/2002 | Lee et al. | |

* cited by examiner

Primary Examiner—Howard L. Williams
(74) Attorney, Agent, or Firm—Brinks Hofer Gilson & Lione

(57) ABSTRACT

An EFM/EFM+ encoding system is adapted to modulate a source symbol sequence into a modulated bit sequence that is further converted to a channel bit sequence, which is to be recorded on a recording medium and which has a cumulative Digital Sum Value (DSV), through NRZI conversion. An apparatus for performing DSV protection in the EFM/EFM+ encoding system includes a DSV calculation unit for calculating the DSV associated with the EFM/EFM+ modulated bit sequence, and a decision unit for adjusting at least a bit in the modulated bit sequence according to the result calculated by the DSV calculation unit such that the channel bit sequence from the NRZI conversion of the adjusted modulated bit sequence accumulates a relatively small DSV. A method of using the EFM/EFM+ encoding system to inhibit disc copying is also disclosed.

19 Claims, 8 Drawing Sheets

F I G. 1
PRIOR ART

| SYMBOL | NEXT STATE | MODULATION CODEWORD | ACCUMULATED DSV |
|---|---|---|---|
| SYNC S0 | S1 | 0001001001000100 0000000000010001 | −10 |
| 94 | S3 | 0010010000100000 | −8 |
| 252 | S1 | 0000010010001001 | −4 |
| 231 | S1 | 0000001001001001 | 0 |
| 231 | S1 | 0000001001001001 | +4 |
| 231 | S1 | 0000001001001001 | +8 |
| ⋮ | ⋮ | ⋮ | ⋮ |
| 231 | S1 | 0000001001001001 | +352 |
| SYNC S5 | S1 | 0010001000000100 0000000000010001 | +346 |
| 94 | S3 | 0010010000100000 | +348 |
| 252 | S1 | 0000010010001001 | +352 |
| 231 | S1 | 0000001001001001 | +356 |
| 231 | S1 | 0000001001001001 | +360 |
| 231 | S1 | 0000001001001001 | +364 |
| ⋮ | ⋮ | ⋮ | ⋮ |

FIG. 2
PRIOR ART

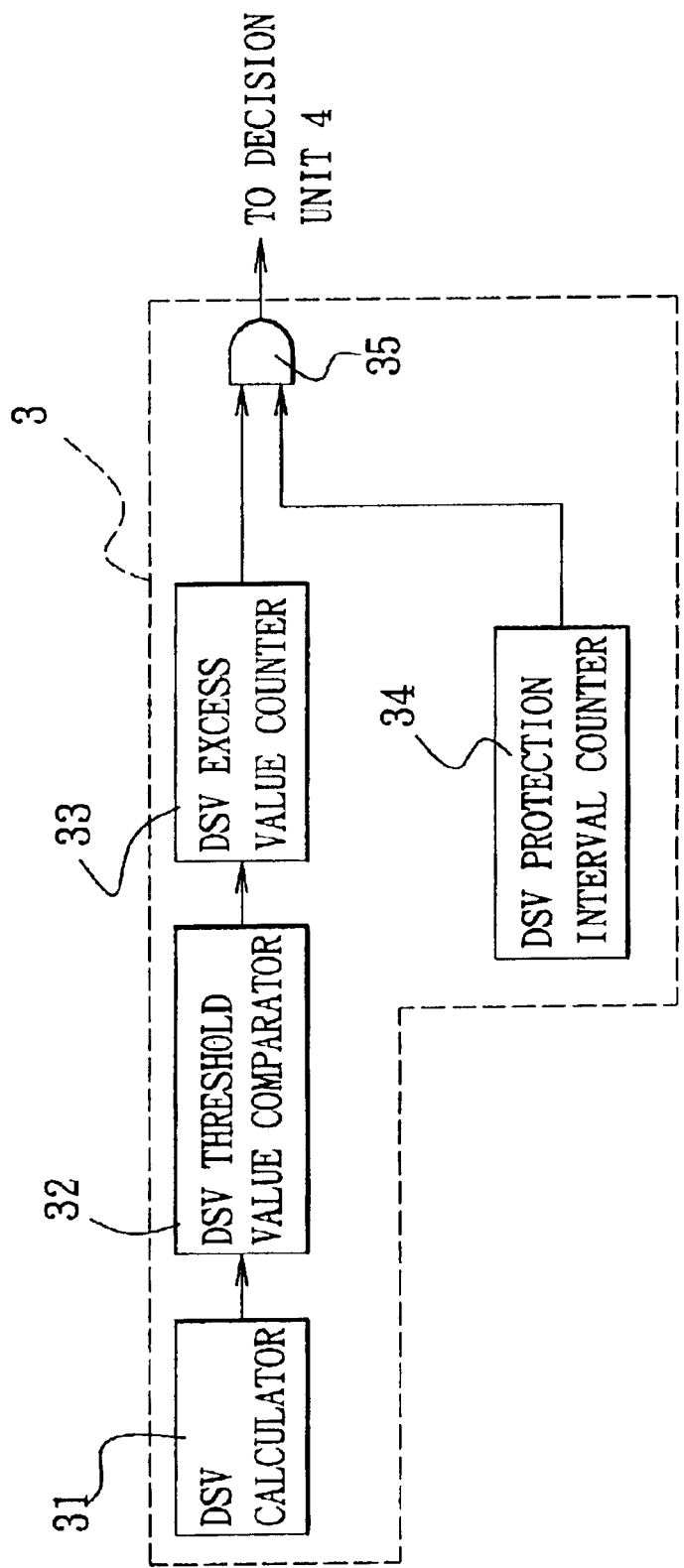
F I G. 5

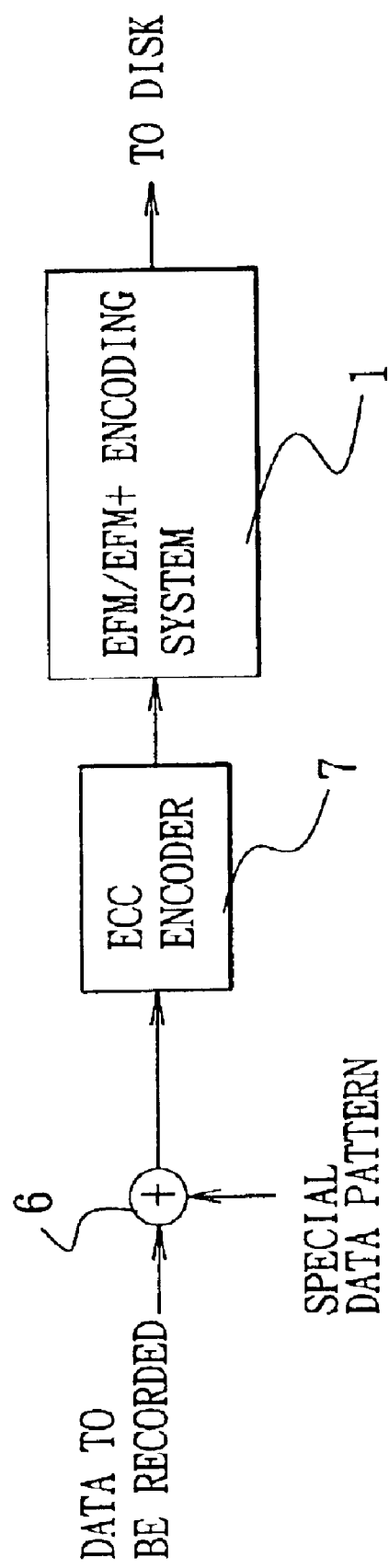
F I G. 8

METHOD AND APPARATUS FOR PERFORMING DSV PROTECTION IN AN EFM/EFM+ ENCODING SAME

CROSS-REFERENCE TO RELATED APPLICATION

This application claims priority of Taiwanese application no. 091112415, filed on Jun. 7, 2002.

BACKGROUND OF THE INVENTION

1. Field of the Invention

The invention relates to an EFM/EFM+ encoding system, more particularly to a method and apparatus that enable an EFM/EFM+ modulated bit sequence to have a relatively small Digital Sum Value (DSV), and to the inhibiting of unauthorized copying of data by introducing special data patterns which cause a relatively large DSV.

2. Description of the Related Art

Generally, digital data is seldom transmitted or recorded directly in its original digital form. Prior to transmission or recording of digital data, the digital data is usually converted to another data pattern through a certain modulation method. In compact disc (CD) or digital versatile disc (DVD) recording systems, the data to be recorded on a compact disc is modulated using EFM (eight-to-fourteen modulation), whereas the data to be recorded on a digital versatile disc is modulated using EFM+ (eight-to-fourteen modulation plus). However, during the process of EFM or EFM+ modulation, in case there exist certain special data patterns in the modulated data, these special data patterns will cause the modulated bit sequence to produce a very large variance of DSV (Digital Sum Value). For instance, referring to FIG. 1, when EFM is used to modulate a special data pattern of {0x9a, 0xb9, 0x9a, 0xb9, 0x9a, 0xb9, . . . } (hexadecimal form), it is noted that the absolute value of DSV generated from the channel bits after modulation will cumulatively increase and cannot be controlled via the standard EFM modulation. If the value of DSV cannot be controlled to be small, the excessively large DSV of the recorded data results in that the data slicer, conventionally used to retrieve the binary signal from the analog signal detected on optical discs, cannot function correctly, and the data readout from the disc is erroneous. Moreover, the large DSV variance implies that the EFM signal is no longer DC-free, i.e., free of direct current (DC) components, and the low-frequency components of the EFM signal interfere with the related servo control signal of the optical disc system. Therefore, to solve such a problem of EFM/EFM+ modulation, the current CD/DVD specifications provide a data scrambling mechanism, which re-arranges the original data to prevent emergence of the aforesaid special data pattern, to avoid occurrence of such a situation (i.e., excessively large DSV). EFM+ is a state-dependent modulation, and the modulation proceeds according to the state determined by the preceding symbol and the current symbol, which ensures that the adjacent codewords, when connected, can comply with the run length limit (RLL) of 3~11T even without the need for a merging bits mechanism used in EFM modulation. In EFM+ modulation, more than one codeword maybe available for a data symbol in some cases, and the codeword with the smallest DSV is selected as the modulation result. However, if a special data pattern, such as {94, 252, 231, 231, 231, 231, . . . } is to be modulated using EFM+, the situation that DSV cumulatively increases will occur, as shown in FIG. 2. Besides, in the DVD system, a "SYNC-code reselection algorithm" has been proposed heretofore to limit the largest variance of DSV and prevent the divergence of DSV. Although the SYNC-code reselection algorithm provided by EFM+ can prevent undesired DSV divergence, a very large DSV (around ±300~400) will still be generated. When DSV is very large, the modulated EFM signal is not DC-free, and the conventional data slicer used to retrieve data recorded on optical discs cannot work correctly. Therefore, the mechanism in the aforesaid CD/DVD specifications can only reduce the possibility of appearance of these special data patterns and limit the damage caused thereby. These special data patterns may still occasionally appear in general data and can hinder reading of data recorded on discs.

In addition, a number of disc copying protection methods have been proposed heretofore using the aforesaid special data patterns. For instance, U.S. Pat. No. 5,828,754 discloses a method of inhibiting copying of digital data in a digital recording system, such as DVD-ROM, in which special data patterns are added into source data before error correcting code (ECC) encoding so that ECC encoded data causes large DSV variance after EFM/EFM+ modulation. In view of the designed large DSV variance, certain deliberate errors are added into a sequence of ECC encoded symbols to interrupt the continuity of the special patterns leading to DSV progression. Subsequently, the final data is recorded on a disc, and this disc is called an authorized disc. The source data on an authorized disc can be read out correctly, because the deliberate errors can prevent the DSV accumulation generated by the special patterns and can be corrected after ECC decoding. However, once the source data is read out from an authorized disc and is reproduced on a recorded disc via the standard encoding process, the source data on the newly reproduced disc cannot be read back. This is because the deliberate errors for preventing the DSV accumulation are not generated in the standard encoding process, thereby achieving the function of inhibiting disc copying. However, the method according to the aforesaid patent suffers the following drawbacks:

1. The deliberate errors, added into the data prior to EFM/EFM+ modulation so as to avoid the excessively large DSV, require correction by the ECC in the CD/DVD. In other words, this method sacrifices a part of the capability of the ECC, and diminishes the tolerance of the optical disc with regard to other errors.
2. As the processed special symbols are selected by the system itself, it is easy to find out ways of writing error symbols in order to control DSV progression. However, the aforesaid patent is silent in regard to how to control the DSV variance of random special symbols that are not generated by the system itself.
3. In the aforesaid patent, the symbol sequence is processed further after ECC encoding, which is very inconvenient in actual use. For instance, if an entry of data is to be recorded on a disc, and the method disclosed in the aforesaid patent is used to prevent DSV progression or copying of the disc, ECC encoding of the entry of data has to be done on the computer first, followed by calculation of the DSV of the entry of data after EFM/EFM+ modulation thereof, and substitution of certain symbols. Finally, the processed symbol sequence is recorded on the disc using a recorder. Such complicated operations cannot be performed on structures of current CD/DVD recording devices to achieve real time prevention of DSV progression or inhibit disc copying.

SUMMARY OF THE INVENTION

Therefore, the main object of the present invention is to provide a method and apparatus for performing DSV protection in an EFM/EFM+ encoding system to ensure that an EFM/EFM+ modulated bit sequence has a relatively small Digital Sum Value (DSV) so as to facilitate reading.

Another object of the present invention is to provide a method and apparatus for performing DSV protection in an EFM/EFM+ encoding system that can inhibit unauthorized disc copying by introducing special data patterns into the data before performing DSV protection on the data.

According to one aspect of the invention, there is provided a method for performing Digital Sum Value (DSV) protection in an Eight-to-Fourteen/Eight-to-Fourteen Plus (EFM/EFM+) encoding system. The EFM/EFM+ encoding system is adapted to modulate a source symbol sequence into a modulated bit sequence that is further converted to a channel bit sequence, which is to be recorded on a recording medium and which is associated with a cumulative DSV, through Non-Return-to-Zero-Inverse (NRZI) conversion. The method comprises the steps of:

a) calculating the DSV associated with the EFM/EFM+ modulated bit sequence; and b) according to the DSV calculated in step a), adjusting at least a bit in the modulated bit sequence such that the channel bit sequence from the NRZI conversion of the modulated bit sequence accumulates a relatively small DSV.

According to another aspect of the invention, there is provided a method of using an Eight-to-Fourteen/Eight-to-Fourteen Plus (EFM/EFM+) encoding system to inhibit disc copying. The method comprises the steps of:

a) finding a special data pattern that will generate a large Digital Sum Value (DSV) during modulation in the EFM/EFM+ encoding system;

b) adding the special data pattern to data that is to be recorded;

c) performing error correcting code (ECC) encoding upon the data obtained in step b);

d) performing EFM/EFM+ modulation of the data, obtained in step c) using the EFM/EFM+ encoding system to result in a modulated bit sequence;

e) calculating the DSV associated with the EFM/EFM+ modulated bit sequence; and f) according to the DSV calculated in step e) adjusting at least a bit in the modulated bit sequence such that a channel bit sequence from subsequent Non-Return-to-Zero-Inverse (NRZI) conversion of the modulated bit sequence accumulates a relatively small DSV.

According to still another aspect of the invention, there is provided an apparatus for performing Digital Sum Value (DSV) protection in an Eight-to-Fourteen/Eight-to-Fourteen Plus (EFM/EFM+) encoding system. The EFM/EFM+ encoding system is adapted to modulate a source symbol sequence into a modulated bit sequence that is further converted to a channel bit sequence, which is to be recorded on a recording medium and which has a cumulative DSV, through Non-Return-to-Zero-Inverse (NRZI) conversion. The apparatus comprises a DSV calculation unit adapted to calculate the DSV associated with the EFM/EFM+ modulated bit sequence, and a decision unit coupled to the DSV calculation unit and adapted to adjust at least a bit in the modulated bit sequence according to the result calculated by the DSV calculation unit such that the channel bit sequence from the NRZI conversion of the adjusted modulated bit sequence accumulates a relatively small DSV.

According to yet another aspect of the invention, an Eight-to-Fourteen/Eight-to-Fourteen Plus (EFM/EFM+) encoding system capable of Digital Sum Value (DSV) protection comprises:

an EFM/EFM+ modulating device adapted to modulate a source symbol sequence into a modulated bit sequence that is further converted to a channel bit sequence, which is to be recorded on a recording medium and which is associated with a cumulative DSV, through Non-Return-to-Zero (NRZI) conversion;

a DSV calculation unit coupled to the EFM/EFM+ modulating device for calculating the DSV associated with the EFM/EFM+ modulated bit sequence; and a decision unit coupled to the DSV calculation unit and the EFM/EFM+ modulating device for adjusting at least a bit in the modulated bit sequence according to the result calculated by the DSV calculation unit such that the channel bit sequence from the NRZI conversion of the adjusted modulated bit sequence accumulates a relatively small DSV.

BRIEF DESCRIPTION OF THE DRAWINGS

Other features and advantages of the present invention will become apparent in the following detailed description of the preferred embodiment with reference to the accompanying drawings, of which:

Figure 1:
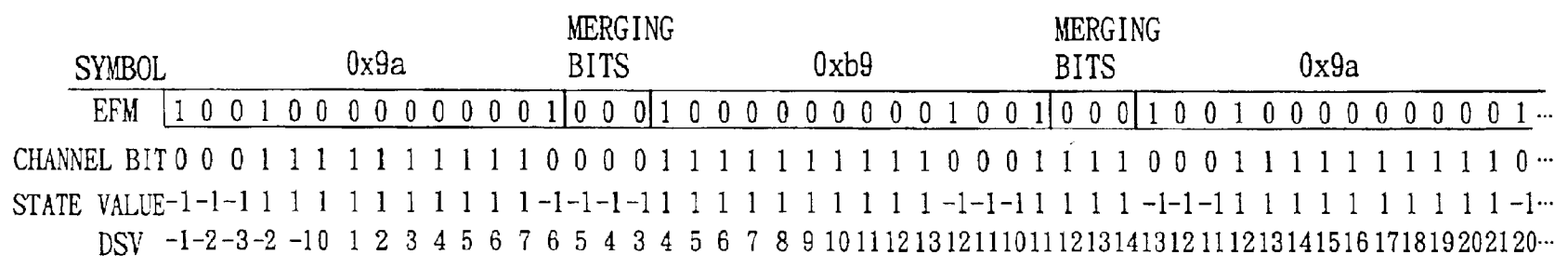

FIG. 1 illustrates how a special data pattern is modulated in a conventional manner using EFM for CD applications;

FIG. 2 illustrates how a special data pattern is modulated in a conventional manner using EFM+ for DVD applications;

FIG. 5 is a circuit block diagram illustrating a DSV calculation unit of the EFM/EFM+ encoding system of FIG. 3;

FIG. 8 is a circuit block diagram illustrating how the EFM/EFM+ encoding system of FIG. 3 can be used to inhibit unauthorized disc copying.

DESCRIPTION OF THE PREFERRED EMBODIMENT

Figure 3:
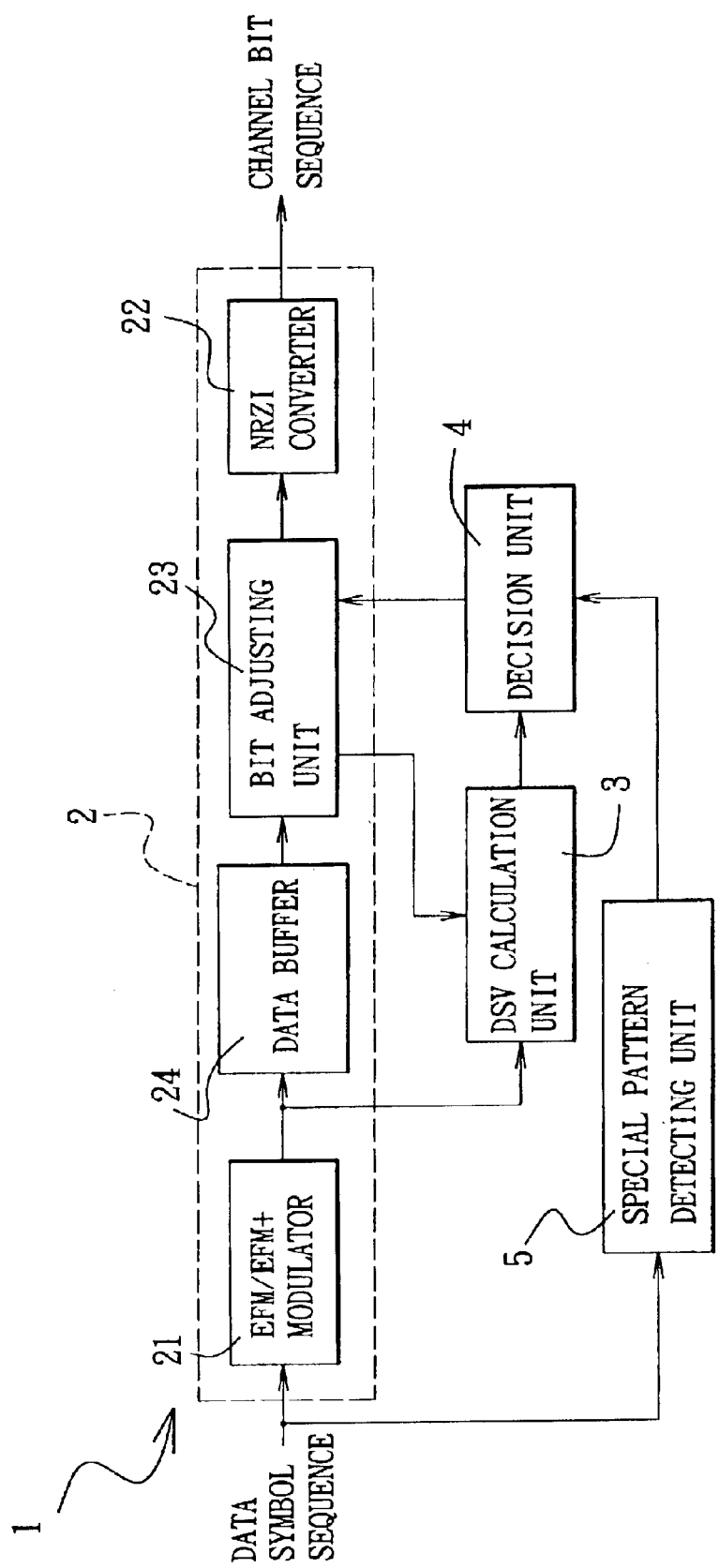
FIG. 3 is a block diagram showing an EFM/EFM+ encoding system that incorporates the preferred embodiment of an apparatus for performing DSV protection according to the present invention.
Figure 4:
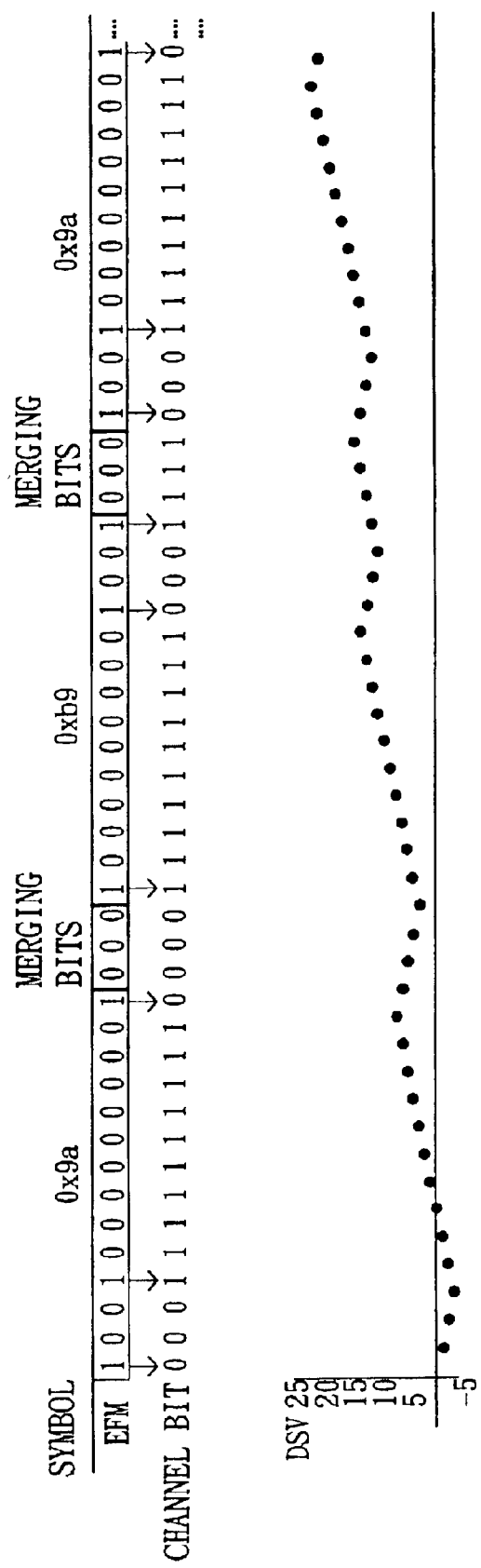
FIG. 4 illustrates how undesired DSV propagation occurs in an EFM encoding system, used for CD applications, without the DSV protection of this invention.

FIG. 3 illustrates an EFM/EFM+ encoding system 1 that incorporates the preferred embodiment of an apparatus for performing DSV protection according to the present invention. By virtue of the apparatus of the preferred embodiment, the EFM/EFM+ encoding system 1 is provided with a built-in DSV protection function. As shown, the EFM/EFM+ encoding system 1 includes an EFM/EFM+ modulating device 2, a DSV calculation unit 3, and a decision unit 4. The EFM/EFM+ modulating device 2 includes an EFM/EFM+ modulator 21, a Non-Return-to-Zero-Inverse (NRZI) converter 22, and a bit adjusting unit 23 interconnecting the EFM/EFM+ modulator 21 and the NRZI converter 22. The EFM/EFM+ modulator 21 is adapted to receive a source symbol sequence for performing EFM or EFM+ modulation in a known manner. For example, with further reference to FIG. 4, to perform the EFM modulation, used for CD applications, of the source symbol sequence {0x9a, 0xb9, 0x9a, 0xb9, 0x9a, 0xb9, . . . } (hexadecimal form), the EFM/EFM+ modulator 21 will firstly convert each 8-bit symbol to a corresponding 14-bit codeword according to a symbol conversion table (not shown). Then, in order to enable adjacent codewords to satisfy the run length limit (RLL) requirement of 3~11T when connected, merging bits that consist of three bits are added between the adjacent codewords to form a modulated bit sequence. Subsequently, the modulated bit sequence is converted by the NRZI converter 22 into a channel bit sequence that is actually recorded on an optical recording medium, such as a disc. Each of the bits in the channel bit sequence has a state value of 1 or −1. These state values are accumulated to generate a Digital Sum Value (DSV), which is used to measure the low-frequency component of the channel bit sequence. If the DSV of the channel bit sequence is limited to a finite value close to zero, the channel bit sequence is called DC-free, i.e., free of direct current (DC) components.

Figure 6:
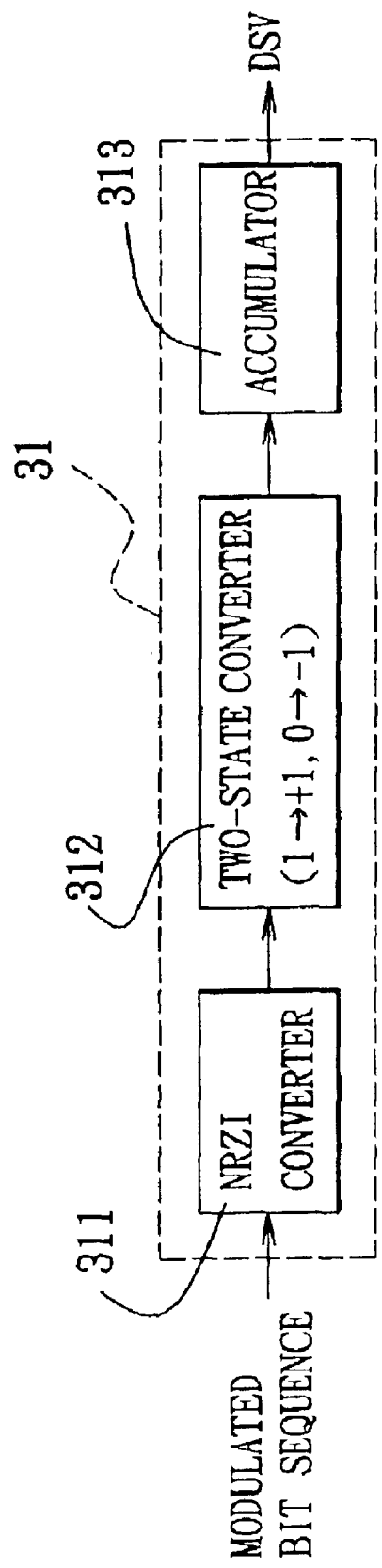
FIG. 6 is a circuit block diagram illustrating a DSV calculator of the DSV calculation unit of FIG. 5.

The method of performing DSV protection in the EFM/EFM+ encoding system 1 according to this invention includes the following steps:

First, the DSV calculation unit 3 is coupled to an output of the EFM/EFM+ modulator 21 so as to calculate the DSV of the modulated bit sequence outputted by the EFM/EFM+ modulator 21. Although decoding errors due to bit alteration in the EFM/EFM+ modulated bit sequence by the DSV protection mechanism of this invention can be corrected through Error Correcting Code (ECC) decoding, it is advisable not to activate the DSV protection mechanism when DSV protection is not actually required. Therefore, in this embodiment, with further reference to FIG. 5, the DSV calculation unit 3 includes a DSV calculator 31, a DSV threshold value comparator 32, a DSV excess value counter 33, a DSV protection interval counter 34, and an AND gate 35. The DSV calculator 31 is used to calculate the DSV of the modulated bit sequence outputted by the EFM/EFM+ modulator 21. As shown in FIG. 6, the DSV calculator 31 includes an NRZI converter 311, a two-state converter 312 and an accumulator 313, which are coupled in sequence. After the NRZI converter 311 converts the modulated bit sequence into a channel bit sequence, the channel bit sequence is provided to the two-state converter 312 for inspection of each bit in the channel bit sequence. The two-state converter 312 assigns each binary ONE in the channel bit sequence with a state value of (+1), and further assigns each binary ZERO in the channel bit sequence with a state value of (−1). The accumulator 313 sums up the state values of the bits in the channel bit sequence to obtain the DSV, which is provided to the DSV threshold value comparator 32. Referring back to FIG. 5, the DSV threshold comparator 32, while considering the tolerance of the data slicer and the range of DSV variance of normal data, determines a DSV threshold value, and detects whether the DSV of the channel bit sequence has exceeded the DSV threshold value. In addition, since the data slicer operates with reference to the DC component of the channel bit sequence, it is not necessary to perform DSV protection on the rapid DSV variance. Therefore, the DSV excess value counter 33 is employed to count the number of consecutive times that the DSV of the channel bit sequence exceeded the DSV threshold value. When the number of consecutive times exceeds a predetermined count, the DSV excess value counter 33 provides a logic "1" output to the AND gate 35. Moreover, in order to prevent consecutive bit alterations for DSV protection from being too close to each other, the interval between two consecutive DSV protections must be limited. Therefore, the DSV protection interval counter 34 is used to count the interval between a location where DSV protection was last performed on the channel bit sequence and a current location on the channel bit sequence. When the interval exceeds a predetermined value, the DSV protection interval counter 34 provides a logic "1" output to the AND gate 35. Therefore, only when the AND gate 35 simultaneously receives the logic "1" outputs from the DSV excess value counter 33 and the DSV protection interval counter 34 will the AND gate 35 provide a logic "1" output to the decision unit 4 to activate the DSV protection mechanism.

Figure 7:
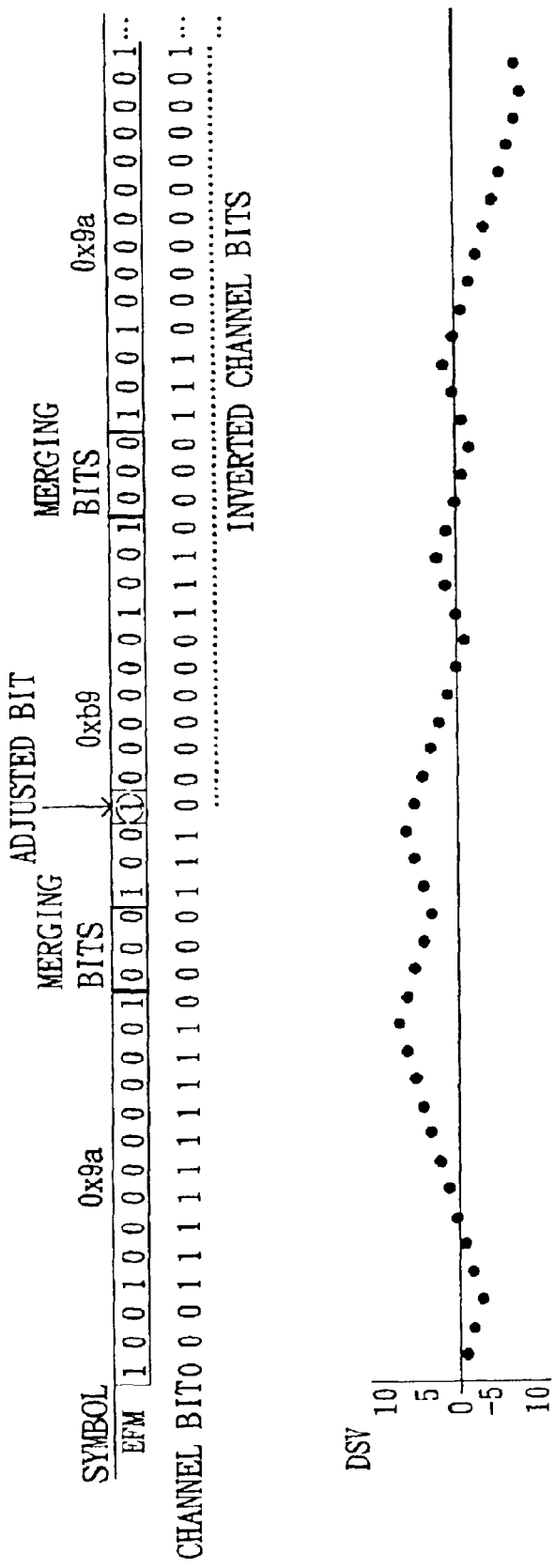
FIG. 7 illustrates how undesired DSV propagation can be prevented in the method and apparatus of the present invention.

Referring once again to FIG. 3, the decision unit 4 is coupled to the DSV calculation unit 3 and the bit adjusting unit 23 of the EFM/EFM+ modulating device 2. When the decision unit 4 is activated by the DSV calculation unit 3 and receives the calculated DSV information from the DSV calculation unit 3, a control signal is transmitted to the bit adjusting unit 23 to adjust bit values in the modulated bit sequence from the EFM/EFM+ modulator 21. Preferably, a segment of the modulated bit sequence that has an odd (or even) number of binary ONEs is adjusted to have an even (or odd) number of binary ONEs. Taking the channel bit sequence shown in FIG. 4 as an example, when the decision unit 4 detects that the DSV of the channel bit sequence has undesirably progressed, the decision unit 4 will instruct the bit adjusting unit 23 to adjust at least a bit in the modulated bit sequence outputted by the EFM/EFM+ modulator 21 from 0 to 1 (or 1 to 0). In view of the characteristics of NRZI conversion, each time a binary ONE is encountered, the output will switch to an opposite state. Therefore, when a binary ZERO at a certain location in the modulated bit sequence is switched to a binary ONE, the bit sequence after the switched bit will be inverted relative to the original bit sequence, thereby resulting in a reduction in undesired accumulation or progression of the DSV. Thus, for a special data pattern that will generate a large DSV after EFM/EFM+ modulation, such as the modulated bit sequence corresponding to the symbol sequence {0x9a, 0xb9, 0x9a, 0xb9, 0x9a, 0xb9, . . . } shown in FIG. 4, after adjustment of a binary ZERO to a binary ONE at a certain location of the modulated bit sequence by the bit adjusting unit 23, the states of the bits in the channel bit sequence from the NRZI converter 22 following the adjusted bit of the modulated bit sequence will be inverted relative the original channel bit sequence, as best shown in FIG. 7. Hence, the DSV of the channel bit sequence from the NRZI converter 22 can be reduced so as to avoid undesired DSV progression. Therefore, when the channel bit sequence is recorded on the disc and is read, there will not be a large DSV variance that inhibits normal reading by the data slicer.

In addition, changing of the bits in the modulated bit sequence by the bit adjusting unit 23 is recommended to obey the following principles:

1. The adjusted modulated bit sequence satisfies the RLL constraint in the EFM/EFM+ modulation.
2. The adjusted modulated bit sequence does not generate a bit pattern that is identical to the sync code of the EFM/EFM+ modulation so as to avoid synchronization problems.
3. Each adjusted bit pattern is limited to be within the same codeword so as to minimize decoding errors.
4. In addition to limiting the adjusted bit pattern to be within the same codeword, the adjusted bit pattern is designed so that it can be detected as an error symbol during EFM/EFM+ demodulation, which provides the error location called erasure for ECC decoding to there by avoid sacrificing too much of the ECC correction capability. As to how to ensure detection of the adjusted bit pattern as an error symbol during EFM/EFM+ demodulation, one way is to look up target bit patterns that satisfy the 3~11T (or 3~12T) RLL constraint but are not valid codewords in the EFM/EFM+ modulation symbol table. Regarding EFM+ modulation, some bit patterns that satisfy the aforesaid conditions are shown as follows: 0100100000000001 0100100001000000 0100100010000000 1000000000010000 . . . .

5. In EFM+ modulation, there are certain ambiguous codewords that require the aid of the third bit and the fifteenth bit of the next codeword during decoding. Thus, in the application of EFM+ modulation, the bit values of the bit pattern relevant to the third bit and the fifteenth bit of an EFM+ codeword should be maintained to avoid generating unnecessary decoding errors.

It is noted from the aforesaid fourth principle that this invention utilizes a bit pattern that can be detected as an error symbol during EFM/EFM+ modulation as the target of bit adjustment. Hence, the DSV of the channel bit sequence can be reduced to prevent undesired progression. Furthermore, because the adjusted bit pattern can be detected as an error symbol during decoding, this invention has a better ECC correction capability as compared to the U.S. patent described hereinabove.

In addition, referring back to FIG. 3, the EFM/EFM+ encoding system 1 may further include a special pattern detecting unit 5 and a data buffer 24. The special pattern detecting unit 5 is coupled to the input of the EFM/EFM+ modulator 21 of the EFM/EFM+ modulating device 2 and to the decision unit 4, and is responsible for detecting whether certain special data patterns that can lead to a large DSV exist in the source symbol sequence for EFM/EFM+ modulation. The special pattern detecting unit 5 is also responsible for informing the decision unit 4 as to possible locations of the special data patterns for reference by the decision unit 4 when performing DSV protection. The data buffer 24 is disposed in the EMF/EMF+ modulating device 2, and is coupled between the EFM/EFM+ modulator 21 and the bit adjusting unit 23 for temporary storage of the modulated bit sequence outputted by the EFM/EFM+ modulator 21. Hence, when the DSV calculation unit 3 detects generation of a large DSV from the modulated bit sequence, the bit adjusting unit 23 will modify the modulated bit sequence stored in the data buffer 24, thereby achieving a better DSV protection effect. Besides, the DSV calculation unit 3 is preferably coupled to the bit adjusting unit 23 so as to be able to synchronize adjustment of the DSV by the DSV calculation unit 3 with adjustment of the modulated bit sequence by the bit adjusting unit 23, thereby ensuring accuracy and consistency of subsequent DSV calculations.

The EFM/EFM+ encoding system 1 of FIG. 3 can be employed to inhibit disc copying. As shown in FIG. 8, a combiner 6 is coupled to an ECC encoder 7, which in turn is coupled to the EFM/EFM+ encoding system 1. The method of inhibiting disc copying according to this invention is as follows:

First, a special data pattern that in general can lead to a large DSV variance during EFM/EFM+ modulation, such as a data pattern of {154, 185, 154, 185, 154, 185, . . . } for EFM modulation and a data pattern {94, 252, 231, 231, 231, 231 . . . } for EFM+ modulation, is found. Then, the special data pattern is combined with the data to be recorded by means of the combiner 6. The location of the special data pattern and the length of the special data pattern can be adjusted to suit the data to be recorded. Subsequently, the output of the combiner 6 is provided to the ECC encoder 7 for ECC encoding. The symbol sequence thus formed after ECC encoding will generate a large DSV variance during standard EFM/EFM+ modulation that can hinder normal reading of the data.

Thereafter, the symbol sequence is provided to the EFM/EFM+ encoding system 1 for EFM/EFM+ modulation and NRZI conversion, and for conversion into a channel bit sequence with a relatively small DSV through the DSV protection mechanism described beforehand. Finally, the resultant channel bit sequence is recorded on the disc.

Therefore, when the aforesaid method is used to record data on a disc, due to the DSV protection of the data, the data can be read correctly. However, when the source data is read from the disc with DSV protection and is reproduced on another disc using the standard encoding process without the DSV protection function that this invention presents, the data containing special data patterns will cause a large DSV variance, and the source data on the newly reproduced disc cannot be read out correctly, thereby inhibiting disc copying.

In sum, in the method and apparatus for performing DSV protection in an EFM/EFM+ encoding system according to this invention, the DSV calculation unit 3 is employed to calculate the DSV associated with the EFM/EFM+ modulated bit sequence converted from a source symbol sequence that is modulated by the EFM/EFM+ modulating device 2. When the DSV exceeds the predetermined DSV threshold value, the bit adjusting unit 23 is controlled to adjust the bit value of a number of bits, such as an odd number, in the channel bit sequence so that the channel bit sequence after conversion by the NRZI converter 22 of the EFM/EFM+ modulating device 2 accumulates a relatively small DSV, thereby ensuring that the data can be read after being recorded. In addition, by virtue of the DSV protection mechanism of this invention, special data patterns that will cause a large DSV in standard EFM/EFM+ modulation can be first located, and these special data patterns can be added at appropriate times to the source data to be recorded. After the data is modulated and converted to a channel bit sequence via the EFM/EFM+ encoding system 1 with the DSV protection mechanism, and the data is recorded on a recording medium, the DSV-protected data can be read correctly. However, when the DSV-protected data is read and reproduced onto another recording medium with the standard encoding process, since the standard EFM/EFM+ encoding system is not provided with the DSV protection mechanism of this invention for performing EFM/EFM+ modulation, the resultant channel bit sequence will have a very large DSV variance so that reading of the recorded data will be hindered, thereby inhibiting disc copying.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for performing Digital Sum Value (DSV) protection in an Eight-to-Fourteen/Eight-to-Fourteen Plus (EFM/EFM+) encoding system, the EFM/EFM+ encoding system being adapted to modulate a source symbol sequence into a modulated bit sequence that is further converted through Non-Return-to-Zero-Inverse (NRZI) conversion to a channel bit sequence which is to be recorded on a recording medium and which is associated with a cumulative DSV, said method comprising the steps of:

a) calculating the DSV associated with the EFM/EFM+ modulated bit sequence; and b) according to the DSV calculated in step a), adjusting at least a bit in the modulated bit sequence such that the channel bit sequence from the NRZI conversion of the modulated bit sequence accumulates a relatively small DSV, and at least one source symbol of the source symbol sequence cannot be obtained from demodulating the adjusted modulated bit sequence.

2. The method as claimed in claim 1, wherein, in step b), a segment of the modulated bit sequence which has an odd number of binary ONES is adjusted so as to have an even number of binary ONEs.

3. The method as claimed in claim 1, wherein, in step b), a segment of the modulated bit sequence which has an even number of binary ONES is adjusted so as to have an odd number of binary ONEs.

4. The method as claimed in claim 1, further comprising, prior to step a), the steps of:

c) finding a special data pattern that in general will generate a large DSV during modulation in the EFM/EFM+ encoding system; and d) adding the special data pattern to the data sequence to be recorded.

5. The method as claimed in claim 4, further comprising, between steps d) and a), the step of:

e) performing error correcting code encoding upon the resultant symbol sequence of step d) prior to modulation by the EFM/EFM+ encoding system.

6. A method of using an Eight-to-Fourteen/Eight to Fourteen Plus (EFM/EFM+) encoding system to inhibit disc copying, comprising the steps of:

a) finding a special data pattern that will generate a large Digital Sum Value (DSV) during modulation in the EFM/EFM+ encoding system;

b) adding the special data pattern to data that is to be recorded;

c) performing error correcting code (ECC) encoding upon the data obtained in step b);

d) performing EFM/EFM+ modulation of the data obtained in step c) using the EFM/EFM+ encoding system to result in a modulated bit sequence;

e) calculating the DSV associated with the EFM/EFM+ modulated bit sequence; and f) according to the DSV calculated in step e), adjusting at least a bit in the modulated bit sequence such that a channel bit sequence from subsequent Non Return to Zero Inverse (NRZI) conversion of the modulated bit sequence accumulates a relatively small DSV.

7. An apparatus for performing Digital Sum Value (DSV) protection in an Eight-to-Fourteen/Eight-to-Fourteen Plus (EFM/EFM+) encoding system, the EFM/EFM+ encoding system being adapted to modulate a source symbol sequence into a modulated bit sequence that is further converted through Non-Return-to-Zero-Inverse (NRZI) conversion to a channel bit sequence which is to be recorded on a recording medium and which has a cumulative DSV, said apparatus comprising:

a DSV calculation unit adapted to calculate the DSV associated with the EFM/EFM+ modulated bit sequence; and a decision unit coupled to said DSV calculation unit and adapted to adjust at least a bit in the modulated bit sequence according to the result calculated by said DSV calculation unit such that the channel bit sequence from the NRZI conversion of the adjusted modulated bit sequence accumulates a relatively small DSV, and at least one source symbol of the source symbol sequence cannot be obtained from demodulating the adjusted modulated bit sequence.

8. The apparatus as claimed in claim 7, further comprising a bit adjusting unit which is coupled to said decision unit and which is adapted to be coupled to the EFM/EFM+ encoding system, said bit adjusting unit being controlled by said decision unit to adjust the modulated bit sequence.

9. The apparatus as claimed in claim 8, wherein said bit adjusting unit adjusts a segment of the modulated bit sequence which has an odd number of binary ONES so as to have an even number of binary ONEs.

10. The apparatus as claimed in claim 8, wherein said bit adjusting unit adjusts a segment of the modulated bit sequence which has an even number of binary ONES so as to have an odd number of binary ONEs.

11. The apparatus as claimed in claim 8, further comprising a data buffer adapted to be coupled between the EFM/EFM+ encoding system and said bit adjusting unit for temporary storage of the modulated bit sequence from the EFM/EFM+ encoding system, said bit adjusting unit adjusting the modulated bit sequence stored in said data buffer when said DSV calculation unit detects a relatively large DSV.

12. The apparatus as claimed in claim 7, further comprising a special pattern detecting unit coupled to said decision unit and adapted to be coupled to the EFM/EFM+ encoding system, said special pattern detecting unit being adapted to detect presence of a special data pattern which can lead to a large DSV in the source symbol sequence that is provided to the EFM/EFM+ encoding system, and being capable of informing said decision unit as to location of the special data pattern for reference by said decision unit.

13. The apparatus as claimed in claim 7, further comprising a combiner adapted to be coupled to the EFM/EFM+ encoding system and adapted to combine the source symbol sequence and a special data pattern prior to modulation by the EFM/EFM+ encoding system.

14. The apparatus as claimed in claim 13, further comprising an error correcting code (ECC) encoder adapted to be coupled between said combiner and the EFM/EFM+ encoding system, for performing ECC encoding upon output of said combiner prior to being received by the EFM/EFM+ encoding system.

15. An Eight to Fourteen/Eight to Fourteen Plus (EFM/EFM+) encoding system capable of Digital Sum Value (DSV) protection, comprising:

an EFM/EFM+ modulating device adapted to modulate a source symbol sequence into a modulated bit sequence that is further converted to a channel bit sequence, which is to be recorded on a recording medium and which is associated with a cumulative DSV, through Non-Return-to-Zero (NRZI) conversion;

a DSV calculation unit coupled to said EFM/EFM+ modulating device for calculating the DSV associated with the EFM/EFM+ modulated bit sequence;

a decision unit coupled to said DSV calculation unit and said EFM/EFM+ modulating device for adjusting at least a bit in the modulated bit sequence according to the result calculated by said DSV calculation unit such that the channel bit sequence from the NRZI conversion of the adjusted modulated bit sequence accumulates a relatively small DSV; and a special pattern detecting unit coupled to said decision unit and said EFM/EFM+ modulating device for detecting presence of a special data pattern which can lead to a large DSV in the source symbol sequence that is provided to said EFM/EFM+ modulating device, and for informing said decision unit as to location of the special data pattern for reference by said decision unit.

16. The EFM/EFM+ encoding system as claimed in claim 15, wherein said EFM/EFM+ modulating device includes an EFM/EFM+ modulator, an NRZI converter, and a bit adjusting unit coupled between said EFM/EFM+ modulator and said NRZI converter, said EFM/EFM+ modulator being coupled to said DSV calculation unit and being adapted to modulate the source symbol sequence to result in the modulated bit sequence, said NRZI converter converting the modulated bit sequence into the channel bit sequence, said bit adjusting unit being further coupled to and being controlled by said decision unit so as to adjust the modulated bit sequence such that the channel bit sequence converted by said NRZI converter from the adjusted modulated bit sequence accumulates the relatively small DSV.

17. The EFM/EFM+ encoding system as claimed in claim 16, wherein said bit adjusting unit adjusts a segment of the modulated bit sequence which has an odd number of binary ONEs so as to have an even number of binary ONEs.

18. The EFM/EFM+ encoding system as claimed in claim 16, wherein said bit adjusting unit adjusts a segment of the modulated bit sequence which has an even number of binary ONES so as to have an odd number of binary ONEs.

19. The EFM/EFM+ encoding system as claimed in claim 16, wherein said EFM/EFM+ modulating device further includes a data buffer coupled between said EFM/EFM+ modulator and said bit adjusting unit for temporary storage of the modulated bit sequence from said EFM/EFM+ modulator, said bit adjusting unit adjusting the modulated bit sequence stored in said data buffer when said DSV calculation unit detects a relatively large DSV.

* * * * *